United States Patent
Nunnally

(10) Patent No.: US 9,520,511 B2
(45) Date of Patent: Dec. 13, 2016

(54) APPARATUS AND METHOD FOR OPTICALLY INITIATING COLLAPSE OF A REVERSE BIASED P-TYPE-N-TYPE JUNCTION TO CAUSE A SEMICONDUCTOR SWITCH TO TRANSITION FROM A CURRENT BLOCKING MODE TO A CURRENT CONDUCTION MODE

(71) Applicant: Applied Physical Electronics, L.C., Austin, TX (US)

(72) Inventor: William C. Nunnally, Austin, TX (US)

(73) Assignee: Applied Physical Electronics L.C., Austin, TX (US)

( * ) Notice: Subject to any disclaimer, the term of this patent is extended or adjusted under 35 U.S.C. 154(b) by 138 days.

(21) Appl. No.: 14/604,703

(22) Filed: Jan. 24, 2015

(65) Prior Publication Data
US 2015/0214389 A1   Jul. 30, 2015

Related U.S. Application Data

(63) Continuation of application No. PCT/US2013/053005, filed on Jul. 31, 2013.
(Continued)

(51) Int. Cl.
| | |
|---|---|
| *H01L 31/0288* | (2006.01) |
| *H01L 31/11* | (2006.01) |
| *H01L 31/111* | (2006.01) |
| *H01L 31/113* | (2006.01) |
| *H01L 31/105* | (2006.01) |
| *H01L 31/167* | (2006.01) |

(52) U.S. Cl.
CPC ........ *H01L 31/0288* (2013.01); *H01L 31/105* (2013.01); *H01L 31/111* (2013.01); *H01L 31/1105* (2013.01); *H01L 31/1113* (2013.01); *H01L 31/1136* (2013.01); *H01L 31/167* (2013.01)

(58) Field of Classification Search
CPC .............. H01L 31/0288; H01L 31/1105; H01L 31/1113; H01L 31/1136; H01L 31/167
USPC ..... 250/214 R, 214.1, 214 LS; 257/113–115, 257/118
See application file for complete search history.

(56) References Cited

U.S. PATENT DOCUMENTS

| | | | |
|---|---|---|---|
| 3,832,732 A * | 8/1974 | Roberts | ............... H01L 27/0817 257/118 |
| 2007/0108558 A1 | 5/2007 | Nemoto | |

(Continued)

FOREIGN PATENT DOCUMENTS

| | | | | |
|---|---|---|---|---|
| EP | 1 184 948 | 3/2002 | ............. | H01S 3/131 |

OTHER PUBLICATIONS

International Search Report and Written Opinion for Application No. PCT/US2013/053005, 10 pages, Jan. 17, 2014.

*Primary Examiner* — Que T Le
(74) *Attorney, Agent, or Firm* — G+J Law Group PLLC; Cyrus F. Bharucha; Georgios A. Georgakis

(57) ABSTRACT

An optical method of collapsing the electric field of an innovatively fabricated, reverse-biased PN junction causes a semiconductor switch to transition from a current blocking mode to a current conduction mode in a planar electron avalanche. This switch structure and the method of optically initiating the switch closure is applicable to conventional semiconductor switch configurations that employ a reverse-biased PN junction, including, but not limited to, thyristors, bipolar transistors, and insulated gate bipolar transistors.

19 Claims, 6 Drawing Sheets

Related U.S. Application Data

(60) Provisional application No. 61/679,686, filed on Aug. 4, 2012.

(56) References Cited

U.S. PATENT DOCUMENTS

| | | |
|---|---|---|
| 2010/0140730 A1 | 6/2010 | Soloviev |
| 2011/0024768 A1 | 2/2011 | Veliadis |
| 2011/0233380 A1 | 9/2011 | Sheu |

\* cited by examiner

APPARATUS AND METHOD FOR OPTICALLY INITIATING COLLAPSE OF A REVERSE BIASED P-TYPE-N-TYPE JUNCTION TO CAUSE A SEMICONDUCTOR SWITCH TO TRANSITION FROM A CURRENT BLOCKING MODE TO A CURRENT CONDUCTION MODE

This application is a continuation of International Patent Application No. PCT/US2013/053005, filed Jul. 31, 2013, titled "APPARATUS AND METHOD FOR OPTICALLY INITIATING COLLAPSE OF A REVERSE BIASED P-TYPE-N-TYPE JUNCTION," and naming William C. Nunnally as inventor, which in turn claims the benefit of priority of U.S. Provisional Patent Application No. 61/679,686, filed Aug. 4, 2012. The aforementioned patent applications are hereby incorporated by reference herein, in their entirety and for all purposes.

FIELD OF THE INVENTION

The present invention relates to electronic semiconductor switches and, more particularly, to all semiconductor switches that employ P-type:N-type junctions for blocking conduction, including but not limited to diodes, all types of thyristors, insulated gate bipolar transistors, and bipolar transistors.

SUMMARY

In accordance with the present invention, there is provided an optical method of initiating the collapse of the electric field of an innovatively fabricated, reverse biased PN junction to cause a semiconductor switch to transition from a current blocking mode to a current conduction mode in a planar electron avalanche fashion. This method of fabricating and optically initiating the switch closure is applicable to conventional semiconductor switch configurations that employ a reverse biased PN junction, including, but not limited to, thyristors, bipolar transistors, and insulated gate bipolar transistors. This invention is also directed to a method of initiating (triggering) a planar, electron avalanche closure of these types of semiconductor switches with a small quantity of optical energy. In addition, the switch according to the present invention closes or transitions in nanoseconds rather than the tens to hundreds of nanoseconds closure of power semiconductor switches.

BRIEF DESCRIPTION OF THE DRAWINGS

A complete understanding of the preferred embodiments of the present invention may be obtained by reference to the accompanying drawings, when considered in conjunction with the subsequent, detailed description, in which.

DETAILED DESCRIPTION

Advanced power switching technologies are needed to enable future defense and commercial power control capabilities and concepts, but capabilities are presently limited by the availability of precisely controllable, high voltage (10-100 kV), high current (1-100 kA) switches. For example, presently available semiconductor switches are limited in per device parameters on the order of 1 kV and several tens of amps with switching times of several hundred nanoseconds. Conventional high power semiconductor switches rely on the blocking electric field produced by the charge accumulation at the depletion region between P-type material and N-type material which is termed a PN junction. In order to change the switch impedance from a large value to a small value, the PN junction electric field must be collapsed through electron avalanche processes or flooded with sufficient electrical charge to reduce the blocking electric field magnitude. Most semiconductor switches including all types of thyristors, bipolar transistors (BJTs), insulated gate bipolar transistors (IGBTs), and other devices that employ a reverse biased PN junction to block current flow in the switch "open" condition. Switching from the blocking state to the conduction state is accomplished by injecting charge in the reversed biased junction, by increasing the electric field in the depletion region to exceed the dielectric strength of the junction, and/or injecting avalanche seed electrons into the electric field through capacitive coupling. These processes are spatially and temporally dependent upon the mechanisms required to inject charge, the time required to raise the electric field, or the transverse spreading velocity of the conducting plasma across the entire cross section of the device to reduce the switch impedance.

Therefore, most P-N junction-based switches employing charge injection triggering result in closure times of hundreds of nanoseconds to multiple microseconds that severely limit high power, high frequency operation. More importantly, operating these types of switches in circuits in which the current rise time is much less than the impedance or voltage fall time of the switch result in excessive power dissipation in the switch which further relates to system efficiency and switch lifetime limitations.

Figure 1:
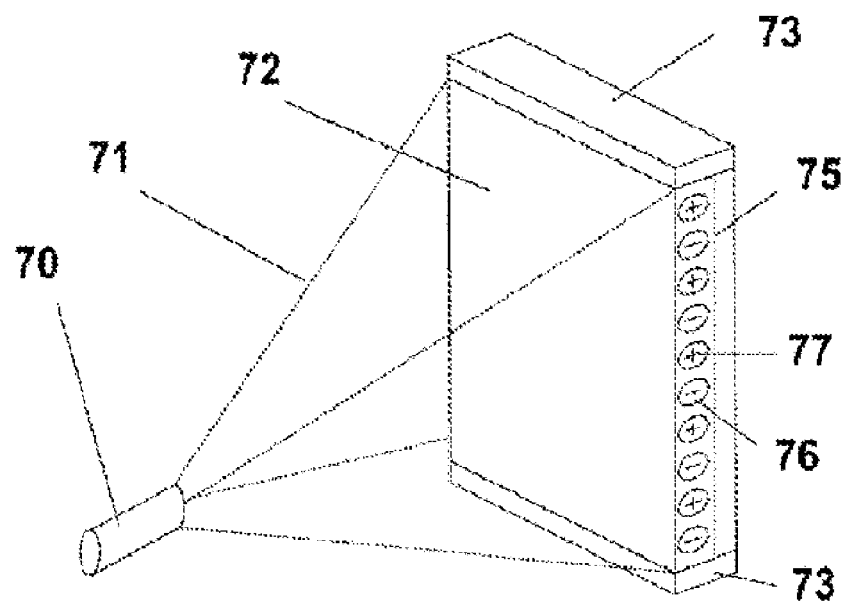
FIG. 1 is a front perspective view of a linear photo conductive switch.

The other approaches to high voltage, high power, high frequency power switches are optically based. Specifically, the three main optically controlled semiconductor switches are (1) linear photo-conductive switches, (2) non-linear optically initiated electron avalanche switches, and (3) optically gated PN junction devices. The most common, linear photo-conductive switches as illustrated in FIG. 1, uses photon energy greater than the semiconductor band gap energy or above band photons from a source (70) to uniformly illuminate a semiconductor (72) between electrodes (73). In a linear photo-conductive switch, the photon energy of the controlling optical source is greater than the semiconductor band gap energy such that the energy is absorbed in the absorption depth (75) of the semiconductor. Ideally, each absorbed photon generates an electron (76) hole (77) pair to reduce the semiconductor resistivity and transition the initial large resistance that limits current flow to a small resistance that permits conduction. The increase in the density of electrons and holes between the switch electrodes reduces the switch resistance in the time the optical energy is delivered to the switch, which can be nanoseconds when a high power optical source such as a laser is employed. The photo-conductivity produced by the optical source decays as determined by the semiconductor recombination time such that the switch will return to a high resistance state when the incident optical energy is terminated. For example, the recombination time in silicon can be as large as milliseconds while the recombination time in gallium arsenide (GaAs) can be less than nanoseconds. Alternatively, the conductivity can be maintained by reducing the optical intensity to the value that compensates for the loss of holes and electrons to recombination.

Figure 2:
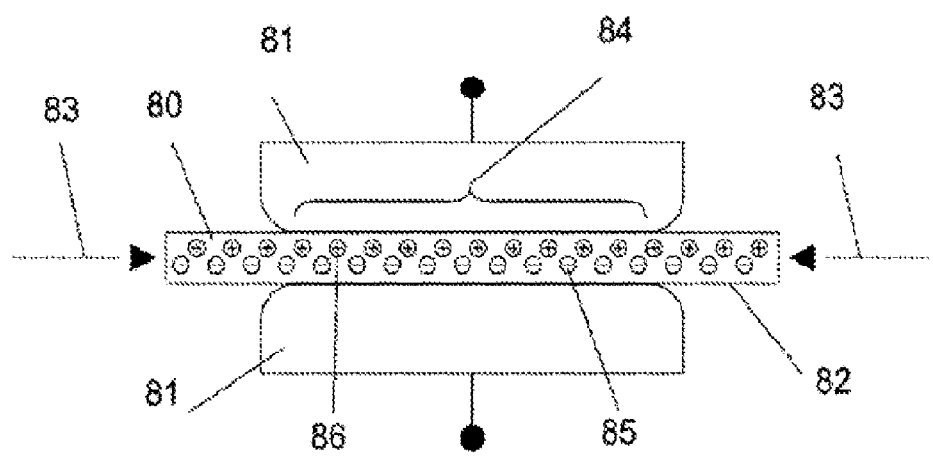
FIG. 2 is a cross-section view of a second configuration of a linear photo-conductive switch.

A second type of linear photo-conductive switch that employs photon energy less than the semiconductor band gap energy or sub-band photons, is illustrated in FIG. 2. In this embodiment, a semiconductor (80) is sandwiched between two electrodes (81). Sub-band photon energy is injected (83) at the edge of the semiconductor. The sub-band photon energy is less than the band gap energy, but sufficient to be absorbed and ionize mid-band dopants. The energy absorbed by mid-band dopants in the semiconductor produce electrons (85) and holes (86) to increase the conductivity of the semiconductor (82) and change the switch impedance from blocking to conduction. In the case of sub-band photons, the effective optical absorption depth can be several cm, for example in the case of silicon carbide, which enables most of the injected optical energy to penetrate to the region between the electrodes (84). A sufficient quantity of sub-band photons is injected and absorbed in the region between the electrodes to increase the semiconductor conductivity and change the switch resistance from a large blocking resistance to an appropriate conduction resistance. In this case, after the optical pulse terminates, the conductivity also returns to the off state with the recombination time of the host material.

Linear photo-conductive switches have demonstrated capability to switch high voltages (10-100 kV) and conduct high currents (1-20 kA) with precise temporal control (sub nanosecond). However, linear photo-conductive switches are limited by the requirement for a substantial laser system that makes them suited only to laboratory systems or fast systems which cannot be provided by other means. Thus linear photo-conductive switches are applicable in high power, precise control or fast rise time pulse generation systems.

Figure 3:
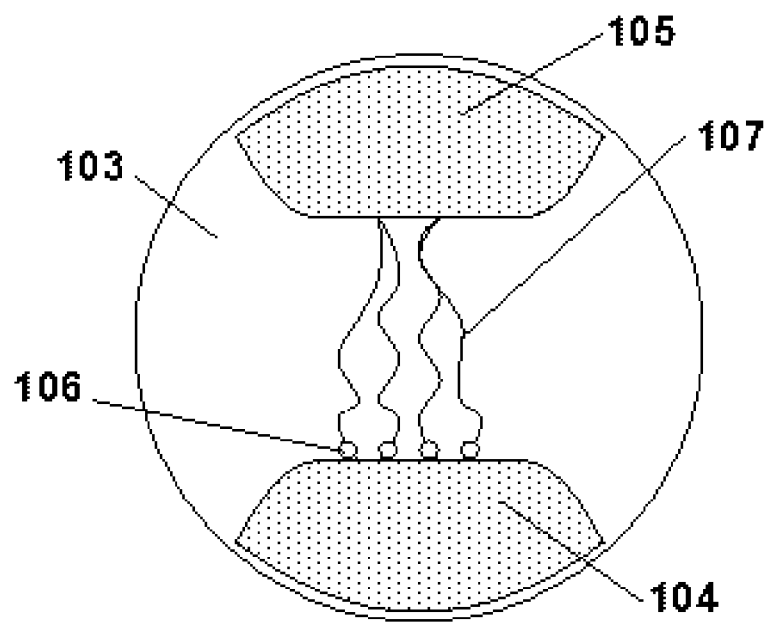
FIG. 3 is the basic non-linear or high gain photo-conductive switch.

The second optically controlled switch technology is based on extensive work at Sandia National Laboratories in Albuquerque (SNLA) in the development of optically initiated electron avalanche switches in gallium arsenide (GaAs). The SNLA approach, illustrated in FIG. 3, is commonly fabricated on the surface of a semi-insulating GaAs wafer (103) by depositing dopants and metals to form contacts (104) and (105). An above-band optical source is configured to inject tens of nano Joules of optical energy via optical fiber or optical components at multiple sites (106) near the cathode electrode (104) to initiate electron avalanche streamers (107) that cross the switch to the anode electrode (105). This GaAs approach is termed a non-linear or high gain approach since the absorbed photons are employed only to initiate an electron avalanche streamer that produce a much larger number of electron-hole pairs through electron impact ionization or avalanche and reduce the optical energy required by up to 4 orders of magnitude when compared to the linear photo-conductive switch approach. A unique feature of the non-liner photo switch in GaAs is that conduction continues after the optical pulse is terminated. This continued conduction is termed "lock on" mode. A major limitation of the non-linear GaAs switch is that the current in each conducting filament is limited to 20-50 amps with the lifetime of the switch inversely related to the filament current. A second limitation of multiple filament non-linear GaAs photo switches is that the filaments initiated at multiple sites tend to coalesce into one conduction path, also illustrated in FIG. 3. The coalesced current density has shown to damage the contacts and the GaAs substrate, which also limits the switch capability.

Figure 4:
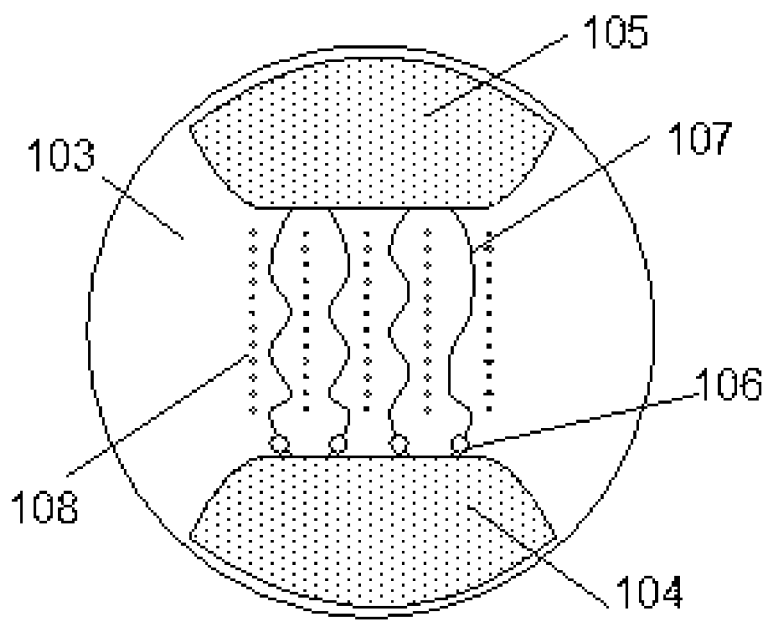
FIG. 4 is an improved non-linear or high gain photo-conductive switch.

In order to increase the current capability of the non-linear switches, much additional work has shown that the path of the individual streamers (107) can be controlled by illuminating lines (108) between the cathode electrode (104) and the anode electrode (105) across the switch (108) as illustrated in FIG. 4.

Figure 5:
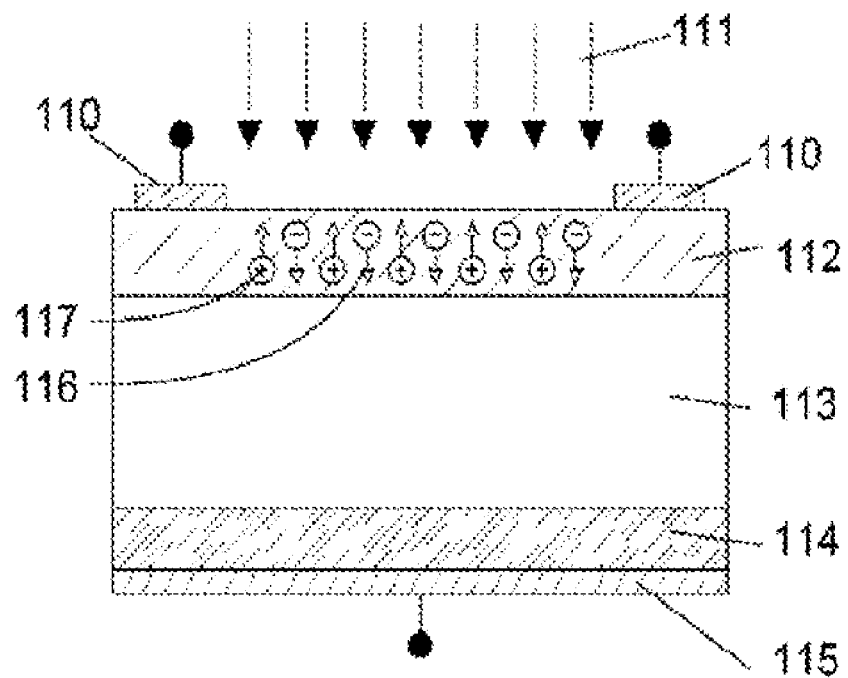
FIG. 5 is an optically gated PIN diode.
Figure 6:
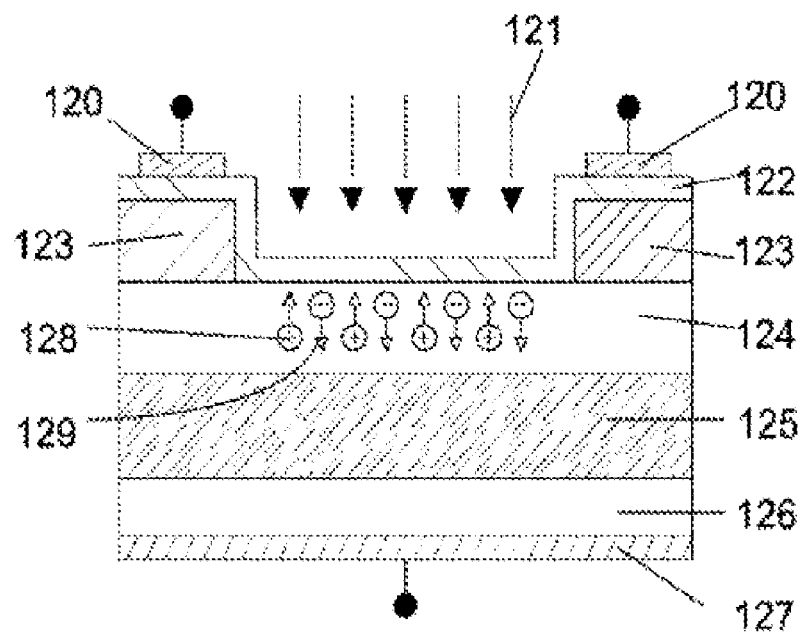
FIG. 6 is an optically gated BJT.

A third optically controlled switch is the optically gated PN junction switch, illustrated in FIG. 5, and an optically gated Bipolar Junction Transistor, illustrated in FIG. 6, as in a reverse biased silicon carbide (SiC) P-type, intrinsic, N-type (PIN) diode.

The optically gated PIN diode of FIG. 5 may be fabricated by depositing contacts (110) on the P-type SiC (112) formed on one side of an intrinsic or slightly N-type SiC wafer (113). A heavily doped n-type layer (114) is formed on the opposite side of the wafer to interface to the negative contact (115). To change the reverse biased PIN diode from blocking current flow to conducting current, above-band photons (111) (photon energy greater than the band gap energy) are deposited in the p-type surface where the energy is absorbed in much less than 1 mm. The photons absorbed in the p-type layer (112) produce electron (116) hole (117) pairs. The holes move toward the negative terminal (110) and the electrons drift into the PIN diode intrinsic wafer (113) to provide seed electrons for avalanche impact ionization and result in current flow through the reverse biased PIN diode. The current conduction continues while the optical energy is present and conduction ceases after the optical energy is terminated and any residual electrons have been swept out of the device.

In the optically gated bipolar junction transistor (BJT) of FIG. 6, above-band photons (121) are projected on the surface of the base region through a silicon dioxide layer (122) and absorbed in a thin layer of the base (124). The absorbed band photons produce electron-hole pairs (128) and (129) in the base region that move in the electric field to the emitter (123) and exit through contact (120) while the electrons are injected into the base (124) collector (125) junction and amplified by the BJT gain to exit to the collector contact (126)/(127). This device is critically dependent upon the optical energy being injected such that current is terminated after the optically generated electrons are swept from the device.

Limitations of Existing Switch Technologies.

Conventional high-voltage semiconductor switches have limited performance portfolios of the combination of operating voltage, operating current, transition or switching time. For example, thyristors can handle moderate voltages (several kilovolts), very large currents (100s of kA), but turn on very slowly (microseconds) while field effect transistors or FETs will support moderate voltages (several kilovolts), turn on very fast (ns) but handle only small currents (tens of amps). Major applications require a switch that will handle large voltages (tens of kV), high currents (several kAs), and transition or turn on rapidly (ns) and operate at high average powers or switching rates. More importantly, handling high power (voltage times current) in high frequency circuits requires that the switch inductance be small which further requires a compact switch. A semiconductor switch that can provide all the necessary parameters, without assembling a large array of switches, does not exist at the present time.

The GaAs switches conduct through optically initiated, electron avalanche current filaments in which the current is limited to about 20-40 amps to prevent GaAs bulk material and contact damage. This feature of non-nonlinear GaAs switches thus requires a very large number of conducting filaments in order to operate in the kA current range. Previous work has demonstrated the ability to initiate multiple conducting filaments using multiple optical fibers (FIG. 3) to initiate multiple triggering points to increase the total switch current. However, multiple conducting filaments, initiated near the cathode, tend to coalesce as the avalanche streamers progress between the switch electrodes at a depth of 50-100 microns. This accumulation of current filaments also damages the contacts and bulk GaAs material. Further work has demonstrated channeling or separation of the conducting filaments using photo-conducting lines across the switch using additional optical energy, as illustrated in FIG. 4. This optical boundary generation, that requires a rather complicated optical arrangement, has permitted the non-linear GaAs switches to be used at higher total currents, but the total current is still less than required for a number of applications, and the optical complexity of the trigger system hinders wide usage. Furthermore, the total optical energy required to control the multiple parallel filaments approaches the quantity required to close a linear photoconductive switch.

One more feature of the GaAs switches is that the switches maintain conduction or "lock-on" after the conducting filaments are formed via electron avalanche streamers, much like gas discharges, that persist until the driving voltage is removed and current ceases. This is not the case for a linear photoconductive switch, using GaAs or other semiconductors, which opens after the optical pulse has terminated with the material recombination time or several tens of ns to return to the multi-mega Ohm resistance. In both types of photo conductive and photo-initiated conduction switches, the conduction voltage is sufficiently large to limit the application of these devices to pulse generation applications with a limited duty cycle.

The optical injection of electrons into both the reverse biased PIN diode, FIG. 5, and the BJT, FIG. 6, using above-band photons is similar to the linear photoconductive switch in that a large quantity of optical energy is required to initiate and sustain conduction. This shortcoming thus requires a large laser which hinders wide application, and in the case of these devices, requires a large UV laser wavelength which is hindered by the transmission of UV photons through optical fibers.

Figure 7:
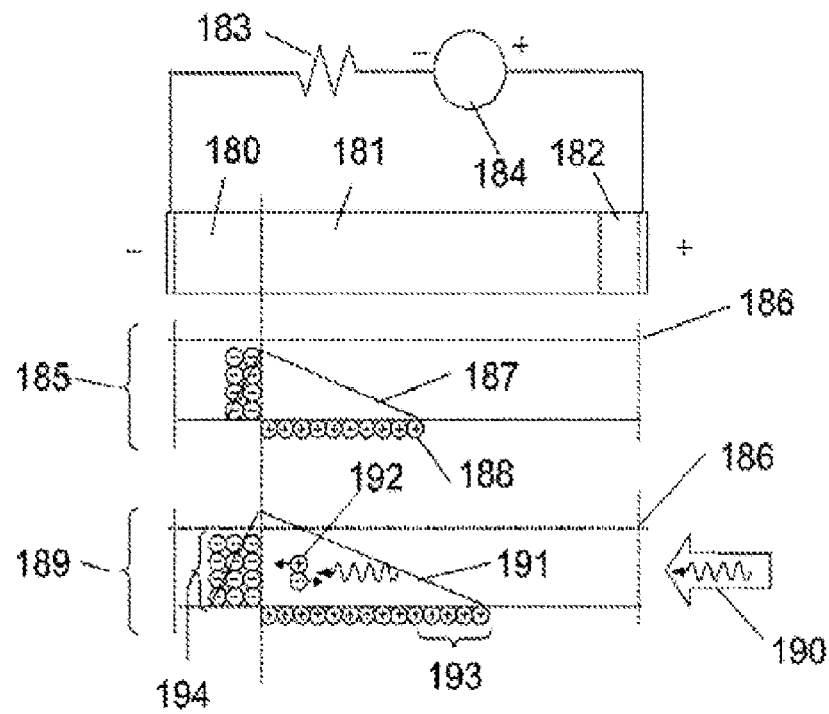
FIG. 7 is an illustration of a reverse biased PN junction in a PIN diode configuration that illustrates the basic principle of the present invention.

FIG. 7 is an illustration of the principle of the present invention, showing a reverse biased PN junction in a PIN configuration, where the P-type (180):intrinsic type (181): N-type (182) structure is reverse biased near voltage breakdown by source (184) in series with load resistor (183). The PN junction electric field, which results in the electric field spatial distribution shown in the plot (185) with a peak value that is less than the breakdown electric field level (186), blocks current flow. In the blocking mode electric field plot (185) the electric field (187) is at a maximum near the P-Intrinsic material interface, but less than the avalanche breakdown electric field value (186). The blocking electric field is a result of the depletion region charge (188). The object of this invention is to initiate an avalanche collapse of the electric field produced by the charges in the reverse-biased depletion region. Prior means of collapsing the blocking electric field have employed an external electric source to raise the reverse voltage on the PN junction to exceed the avalanche breakdown electric field (186).

In the preferred embodiment of the present invention, sub-band optical energy (190) is introduced into the structure to produce electron-hole pairs (192) that move in the electric field (191). The more mobile electrons leave the structure while the slower holes add charge to the intrinsic side of the P-Intrinsic junction. The increase in positive hole charge (193) induces additional negative charge (194) to further increase the electric field (191) to exceed the breakdown level (186) shown, and initiate the collapse of the depletion region through electron avalanche. Therefore, it may be seen that instead of applying a fast rising voltage for the purpose of exceeding the breakdown voltage of a PN junction, the preferred embodiment of the present invention changes the electric field in the depletion region through absorbing sub-band optical energy, near the reverse-biased P-N interface in the structure.

A simple calculation of the additional charge required to increase the PN junction electric field (187) to exceed the breakdown electric field (186) can be used to estimate the equivalent optical energy that is required to produce the electric charge. TABLE 1 is a simple estimation of the optical energy required to overvolt three PIN diodes. For example, to overvolt a reverse biased, 10 kV PIN diode to 13 kV requires an optical energy of less than 100 nJ per square cm, assuming unity quantum efficiency. In the preferred embodiment, the common PIN structure of FIG. 7 is modified to provide the mid-band dopant sites capable of absorbing the sub-band optical energy. Specifically, an additional layer is added to the PN junction interface to preferentially absorb the sub-band optical energy. The new layer can be added via an epitaxial deposition or implantation. The energy level of the dopants in the new layer added to the common PIN structure as part of the preferred embodiment must be mid-band acceptors and/or donors. Therefore, the energy levels of various dopants in the base material must be known.

TABLE 1

Calculation of Over Voltage Charge and Optical Requirements

| Parameter | Symbol | 100 kV PAS | 10 kV PAS | 10 kV PAS | Unit | Comments |
|---|---|---|---|---|---|---|
| Reverse Bias Voltage | | 100 | 10 | 10 | kV | |

TABLE 1-continued

Calculation of Over Voltage Charge and Optical Requirements

| Parameter | Symbol | 100 kV PAS | 10 kV PAS | 10 kV PAS | Unit | Comments |
|---|---|---|---|---|---|---|
| Over Voltage | | 100 | 10 | 3 | kV | |
| Total Applied Voltage | | 200 | 20 | 13 | kV | |
| PIN Structure | | | | | | |
| Cross Section | Ac | 1.00E−4 | 1.00E−04 | 1.00E−04 | m2 | |
| Blocking Voltage | Vb | 1.00E+5 | 1.00E+04 | 1.00E+04 | V | |
| SiC Dielectric Strength | Ebd | 3.00E+8 | 3.00E+08 | 3.00E+08 | V/m | |
| Breakdown Thickness | tbd | 3.33E−4 | 3.33E−05 | 3.33E−05 | m2 | |
| p+ doping | NA | 1.00E+25 | 1.00E+25 | 1.00E+25 | m-3 | |
| n doping | ND | 7.00E+19 | 7.00E+19 | 7.00E+19 | m-3 | Semi-insulating |
| SiC pn voltage | Vo | 3.00E+00 | 3.00+00 | 3.00+00 | V | |
| Blocking Voltage | Va | 1.00E+05 | 1.00E+04 | 1.00E+04 | V | Bias |
| SiC Dielectric Constant | | 9 | 9 | 9 | | |
| Depletion Region Blocking Voltage | | | | | | |
| Wafer Thickness | | 1.50E−03 | 3.50E−04 | 2.50E−04 | m | |
| Blocking Voltage | | 1.00E+05 | 1.00E+04 | 1.00E+04 | V | |
| Depletion Region Width - Blocking | Wjb | 1.19E−03 | 3.77E−04 | 3.77E−04 | m | |
| | xp | 8.35E−09 | 2.64E−09 | 2.64E−09 | m | |
| | xn | 1.19E−03 | 3.77E−04 | 3.77E−04 | m | |
| Electric Field At Interface | Epn | 8.39E+07 | 2.65E+07 | 2.65E+07 | V/m | Blocking E-field |
| SiC Dielectric Constant | | 9 | 9 | 9 | | |
| ancce Depletion Region - Blocking | Cb | 6.68E−12 | 2.11E−11 | 2.11E−11 | F | for 1 sq cm area |
| Blocking Charge Overvoltage | Qb | 6.68E−07 | 2.11E−07 | 2.11E−07 | C | Bias |
| Depletion Region Overvoltage | DV | 1.00E+05 | 1.00E+04 | 3.00E+03 | V | |
| Total Applied Voltage | | 2.00E+05 | 2.00E+04 | 1.30E+04 | V | |
| Risetime | Tr | 1.00E−09 | 1.00E−09 | 1.00E−09 | s | |
| Voltage change rate | dV/dt | 1.00E+14 | 1.00E+13 | 3.00E+12 | V/s | |
| dth 2X over voltage depletion region | Wjov | 1.69E−03 | 5.33E−04 | 4.30E−04 | m | |
| Avalanche Electric Field | Ea | 1.19E+08 | 3.75E+07 | 3.02E+07 | V/m | |
| nce Depletion Region - Overvoltage | Cov | 4.72E−12 | 1.49E−11 | 1.85E−11 | C | |
| 2X Overvoltage Charge | Qa | 9.44E−07 | 2.99E−07 | 2.41E−07 | C | |
| Delta Charge | Qa − Qb | 2.77E−07 | 8.74E−08 | 2.96E−08 | C | Net charge required |
| Wavelength | | 5.32E−07 | 5.32E−07 | 5.32E−07 | m | doubled YAG |
| Frequency | | 5.64E+14 | 5.64E+14 | 5.64E+14 | Hz | |
| Photon Energy | | 3.74E−19 | 3.74E−19 | 3.74E−19 | J | |
| Number Electron-hole pairs | | 1.73E+12 | 5.47E+11 | 1.85E+11 | ea | holes provide charge |
| ergy to produce same delta charge | | 6.46E−07 | 2.04E−07 | 6.91E−08 | J | 1 electron-hole/photon |
| | | 646.26 | 204.30 | 69.09 | nJ | per square cm |
| Number of Photons | | 1.73E+21 | 5.47E+20 | 1.85E+20 | ea | |

Figure 8:
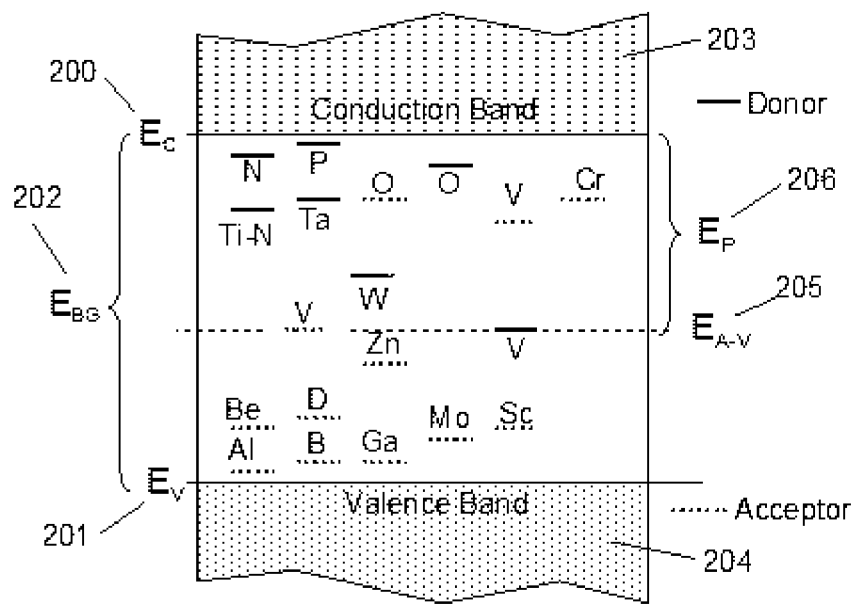
FIG. 8 is a graphical illustration of the energy band structure of silicon carbide (SiC).

FIG. 8 is an illustration of the energy band structure of silicon carbide (SiC). The SiC band gap between the conduction band energy (200) and the valence band energy (201) determines the band gap energy (202). The photon energy required to ionize the mid-band dopants (206) must be less than the band gap energy (202) as illustrated in FIG. 8. Acceptors with energy levels near the valence band and donors with energy levels near the conduction band are ionized at room temperature. Thus dopants with mid-band energy levels, such as vanadium and/or zinc, near the middle of the SiC band gap provide absorption sites for the sub-band optical energy with photon energy sufficient photon energy (206). The relationship of the mid-band dopant energy (205) and the conduction band energy (200) determine the photon energy (206) required to ionize the mid-band dopants. The selection of vanadium as the target absorption requires that the photon energy (206) be greater than the energy required to ionize the vanadium, which is the difference between the conduction band energy (203) and the vanadium acceptor energy (205). For example, the vanadium energy level is about 1.1 eV and the 4H SiC band gap energy is about 3.2 eV such that the sub-band photon energy should be greater than 2.1 eV. The photon energy of various optical sources, calculated in TABLE 2, indicates a green optical source such as doubled YAG laser or a green laser-diode would be sufficient.

TABLE 2

| | Photon Wavelength Energy | | | | |
|---|---|---|---|---|---|
| Source | Nd:YAG | 2 × Nd:YAG | 3 × Nd:YAG | Nitrogen | Unit |
| Photon Wavelength | 1064 | 532 | 355 | 337 | nm |
| Photon Frequency | 2.82E+14 | 5.64E+14 | 8.45E+14 | 8.90E+14 | Hz |
| Photon Energy | 1.87E−19 | 3.74E−19 | 5.60E−19 | 5.90E−19 | J |
| | 1.17 | 2.34 | 3.50 | 3.69 | eV |

Figure 9:
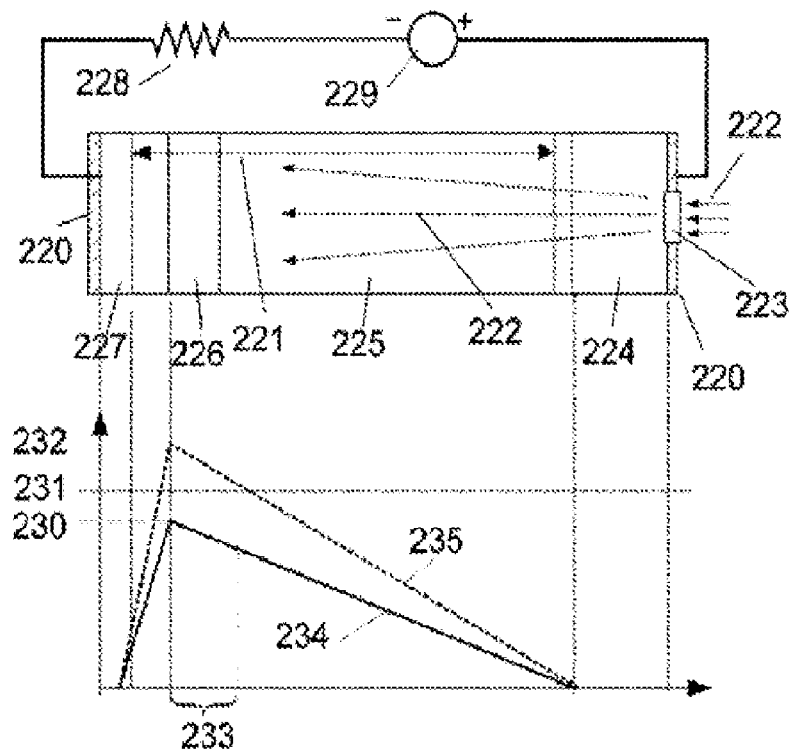
FIG. 9 is a diagram depicting the basic structure of a preferred embodiment of the present invention.

FIG. 9 is an illustration of the basic structure of a preferred embodiment of the present invention according to the principles explained above. Specifically, a PN-type junction with an additional layer at the PN junction interface, in a PIN configuration is reverse biased by source voltage (228) in series with load resistor (229). The metal-Ohmic contact (220) is connected to the load resistance (228) and the voltage source (229) that reverse biased the PN junction. The PIN structure consists of a P-type layer (227) that interfaces to a critical part of this preferred embodiment, a mid-band dopant layer (226). The mid-band dopant layer is formed from an Intrinsic-type material or slightly N-type material doped with a mid-band dopant, preferably including vanadium if a SiC semiconductor implementation is used. This mid-band dopant layer is followed by the Intrinsic layer or slightly N-type layer (222), then the heavily doped N-type layer (224), and the N-type metal-Ohmic contact (220). The reverse biased junction results in a blocking electric field (234), with peak value (23) less than the breakdown electric field (231) in the depletion region (221). The Sub-band optical energy (223) is injected into the structure (through the N-type contact is one option) and is absorbed preferentially in the mid-band dopant layer (226), to produce electrons and holes. The additional holes increase the electric field (235) to exceed the avalanche threshold electric field (232), which results in avalanche breakdown of the SiC in the region (233) near the PN interface. This highly conducting, plasma region then expands to move toward the N-type (224) contact while compressing and increasing the applied electric field to speed the avalanche process in a regenerative manner. As the conducting region reaches the N-type contact, the blocking field and blocking voltage rapidly disappears to allow current to flow through the conducting avalanche plasma.

Figure 10:
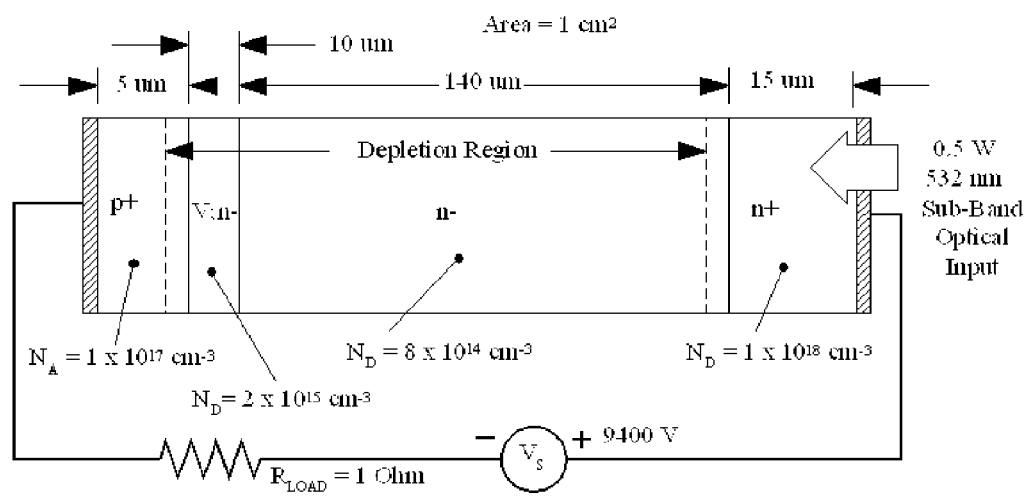
FIG. 10 is a diagram of a 10 kV PIN diode switch, semiconductor physics model indicating model dimensions, model circuit parameters, materials and doping densities.
Figure 11:
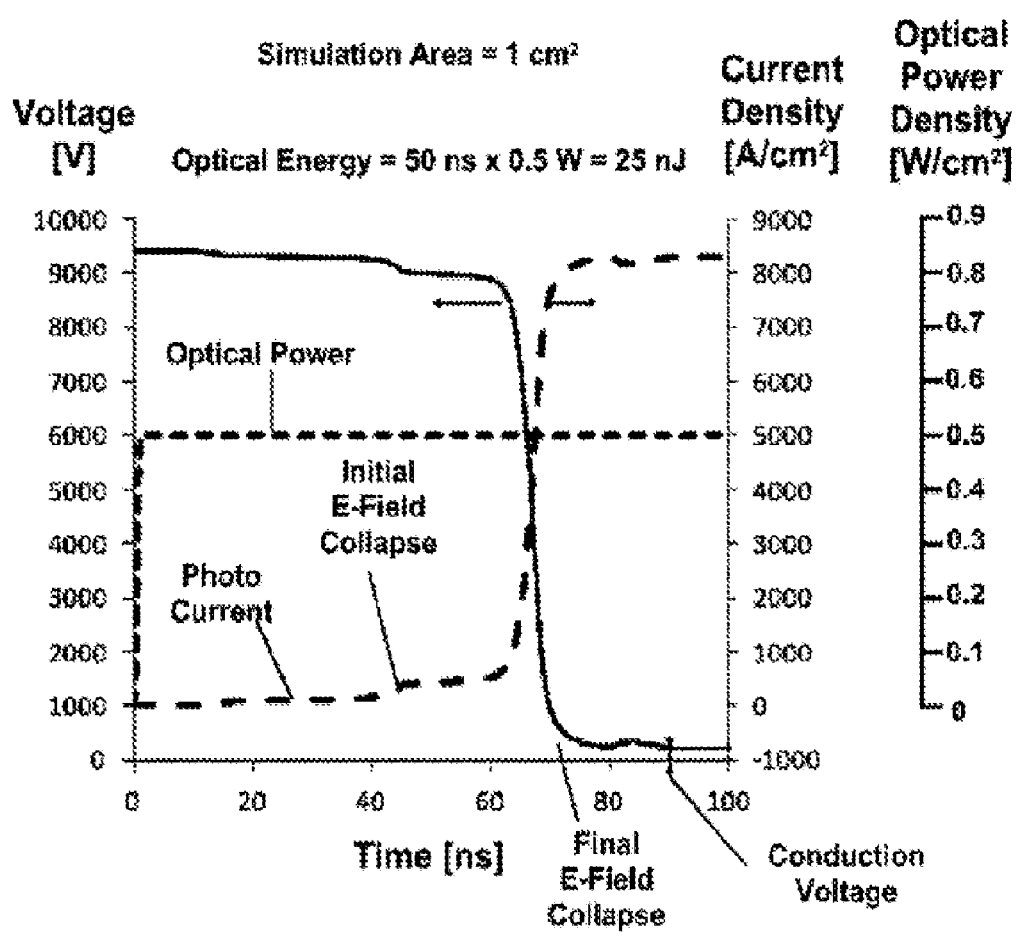
FIG. 11 is a diagram of the semiconductor physics model waveform outputs for PIN diode voltage, PIN diode current density, and optical input.

FIG. 10 is a diagram of the preferred embodiment of a 10 kV PIN diode, semiconductor physics model with the densities, dimensions, and circuit parameters used to generate the operational waveforms shown in FIG. 11.

FIG. 11 is a set of plots of the SiC PIN diode voltage, PIN diode current density, and optical input power for the semiconductor model of FIG. 10 in which the optical power was 0.5 W/cm$^2$ and the initial reverse bias was 9500 V. The avalanche gain in the semiconductor model was adjusted to match reverse self-breakdown voltage of a known SiC PIN diode to calibrate the model.

It will be understood that semiconductor materials other than SiC may be used in the implementation of the invention in various alternative embodiments. Such materials include, without limitation, silicon, gallium arsenide, gallium nitride, and aluminum nitride.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:
1. A semiconductor switch, comprising:
   a. a first layer comprising a P-type semiconductor material;
   b. a second layer comprising a semiconductor material doped with a mid-band dopant, wherein the second layer is in contact with the first layer;
   c. a third layer comprising an Intrinsic-type or slightly N-type semiconductor material, wherein the third layer is in contact with the second layer thereby forming a semiconductor junction interface between the second layer and the third layer; and
   d. a fourth layer comprising an N-type semiconductor material, wherein the fourth layer is in contact with the third layer;
   wherein the semiconductor switch is configurable in a reverse-bias circuit such that in a first switch state the semiconductor junction interface is reverse biased thereby blocking current flow through the circuit in the absence of optical energy from an optical energy source, and wherein optical energy applied to the switch from the optical energy source produces a second switch state in which a sufficient electrical charge is produced in the switch to cause an electric field present at a depletion region in the switch to exceed a breakdown level at the semiconductor junction interface, thereby enabling a flow of current through the switch.

2. The semiconductor switch of claim 1, wherein an energy level of the optical energy applied to the switch from the optical energy source is less than a band-gap energy of a basic material forming the switch, and further wherein the energy level of the optical energy applied to the switch from the optical energy source is sufficient to ionize the mid-band dopant.

3. The semiconductor switch of claim 2, wherein the basic material comprises silicon carbide.

4. The semiconductor switch of claim 3, wherein the mid-band dopant comprises vanadium or zinc or a combination of vanadium and zinc.

5. The semiconductor switch of claim 2, wherein the fourth layer and third layer are configured to allow at least some of the optical energy from the optical energy source to pass through, and the second layer is configured to absorb the optical energy passing through the fourth and third layer.

6. The semiconductor switch of claim 2, further comprising a metal-Ohmic contact forming an electrical connection between the fourth layer and the reverse biasing circuit.

7. The semiconductor switch of claim 6, wherein the metal-Ohmic contact comprises a contact opening, and wherein the metal-Ohmic contact is positioned to receive optical energy from the optical energy source through the contact opening.

8. An optically-activated switching apparatus, comprising:
   a. a semiconductor device, comprising:
      i. a first layer comprising a P-type semiconductor material;
      ii. a second layer comprising a material doped with a mid-band dopant, wherein the second layer is in contact with the first layer;
      iii. a third layer comprising an Intrinsic-type or slightly N-type semiconductor material, wherein the third layer is in contact with the second layer thereby forming a semiconductor interface between the second layer and the third layer; and
      iv. a fourth layer comprising an N-type semiconductor material, wherein the fourth layer is in contact with the third layer;
   b. a reverse biasing circuit electrically connected to the semiconductor device to apply a reverse bias to the semiconductor device; and
   c. an optical energy source configured to selectively direct optical energy onto the semiconductor device.

9. The optically-activated switching apparatus of claim 8, wherein the semiconductor device comprises silicon carbide.

10. The optically-activated switching apparatus of claim 9, wherein the mid-band dopant comprises vanadium.

11. The optically-activated switching apparatus of claim 10, wherein the photon energy of the optical energy source is at least 2.1 eV.

12. The optically-activated switching apparatus of claim 11, wherein the optical energy source is a green light source.

13. The optically-activated switching apparatus of claim 12, wherein the optical energy source comprises a frequency-doubled YAG laser.

14. The optically-activated switching apparatus of claim 11, wherein the optical energy source comprises a green laser diode.

15. The optically-activated switching apparatus of claim 8, wherein the optical energy source is configured to apply the optical energy at the fourth layer.

16. A method for optically activating a semiconductor switch, wherein the switch comprises a first layer comprising a P-type semiconductor material, a second layer comprising a semiconductor material doped with a mid-band dopant, a third layer comprising an Intrinsic-type or slightly N-type semiconductor material, and a fourth layer comprising an N-type semiconductor material, wherein the method comprises the steps of:
   a. reverse biasing the switch by applying a source potential comprising a positive lead and a negative lead, wherein the positive lead is electrically connected to the fourth layer and the negative lead is electrically connected to the first layer;
   b. directing an optical energy source toward the semiconductor switch; and
   c. activating the optical energy source to apply sufficient optical energy to cause an electric field at a depletion layer adjacent an interface within the semiconductor switch to exceed a breakdown level, thereby enabling a flow of current.

17. The method of claim 16, wherein the directing an optical energy source toward the semiconductor switch step comprises the step of directing the optical energy source toward the fourth layer of the semiconductor switch.

18. The method of claim 16, wherein the activating the optical energy source step comprises the application of photon energy of at least 2.1 eV.

19. The method of claim 16, wherein the activating the optical energy source step comprises the application of green optical energy to the semiconductor switch.

* * * * *